(12) United States Patent
Wu et al.

(10) Patent No.: US 11,908,944 B2
(45) Date of Patent: Feb. 20, 2024

(54) CONTACT FORMATION FOR VERTICAL FIELD EFFECT TRANSISTORS

(71) Applicant: International Business Machines Corporation, Armonk, NY (US)

(72) Inventors: Heng Wu, Guilderland, NY (US); Lan Yu, Voorheesville, NY (US); Samuel Sung Shik Choi, Ballston Lake, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 121 days.

(21) Appl. No.: 17/447,904

(22) Filed: Sep. 16, 2021

(65) Prior Publication Data
US 2023/0082449 A1   Mar. 16, 2023

(51) Int. Cl.
| | | |
|---|---|---|
| *H01L 29/78* | (2006.01) | |
| *H01L 29/786* | (2006.01) | |
| *H01L 29/66* | (2006.01) | |
| *H01L 29/417* | (2006.01) | |

(52) U.S. Cl.
CPC .. *H01L 29/78642* (2013.01); *H01L 29/41741* (2013.01); *H01L 29/66666* (2013.01)

(58) Field of Classification Search
CPC ......... H01L 29/78642; H01L 29/41741; H01L 29/66666; H01L 21/28518; H01L 29/7848; H01L 21/823814; H01L 21/823885; H01L 29/165; H01L 29/45; H01L 29/7827
USPC .......................................................... 257/329
See application file for complete search history.

(56) References Cited

U.S. PATENT DOCUMENTS

| | | | |
|---|---|---|---|
| 9,196,730 B1 | 11/2015 | Yu et al. | |
| 9,768,062 B1* | 9/2017 | Kittl | ................. H01L 21/28518 |
| 2018/0331101 A1 | 11/2018 | Anderson et al. | |
| 2020/0052079 A1* | 2/2020 | Li | ..................... H01L 29/66666 |

(Continued)

FOREIGN PATENT DOCUMENTS

| | | |
|---|---|---|
| CN | 105097472 A | 11/2015 |
| WO | 2023040455 A1 | 3/2023 |

OTHER PUBLICATIONS

Notification of Transmittal of The International Search Report and the Written Opinion of the International Searching Authority, or the Declaration, International Application No. PCT/CN2022/106930, dated Sep. 27, 2022, 9 pgs.

*Primary Examiner* — Mohammad M Hoque
(74) *Attorney, Agent, or Firm* — Michael A. Petrocelli

(57) ABSTRACT

A vertical field effect transistor includes a top source/drain region in contact with a top portion of a channel fin extending perpendicularly from a semiconductor substrate, a bottom source/drain region is disposed above the semiconductor substrate and on opposite sidewalls of a bottom portion of the channel fin, a metal gate surrounding the channel fin is separated from the top source/drain region by a top spacer and from the bottom source/drain region by a bottom spacer, the metal gate and the top spacer are in contact with an adjacent first interlevel dielectric layer. A silicide layer is directly above an uppermost surface of the top source/drain region, and a nitride layer is directly above an uppermost surface of the silicide layer. A top source/drain contact, having a size that is substantially less than a length of the channel fin, extends until an uppermost surface of the nitride layer.

8 Claims, 8 Drawing Sheets

(56) References Cited

U.S. PATENT DOCUMENTS

| | | | |
|---|---|---|---|
| 2020/0058766 A1* | 2/2020 | Lee | H01L 29/66666 |
| 2020/0075737 A1* | 3/2020 | Lee | H01L 29/45 |
| 2020/0111714 A1* | 4/2020 | Lee | H01L 29/785 |
| 2020/0279779 A1* | 9/2020 | Li | H01L 29/7827 |
| 2021/0050256 A1 | 2/2021 | Tsai et al. | |
| 2021/0066499 A1* | 3/2021 | Holland | H01L 21/823418 |
| 2021/0273077 A1 | 9/2021 | Xie et al. | |
| 2021/0313441 A1* | 10/2021 | Lin | H01L 29/6653 |
| 2022/0037500 A1* | 2/2022 | Wang | H01L 29/0847 |

\* cited by examiner

CONTACT FORMATION FOR VERTICAL FIELD EFFECT TRANSISTORS

BACKGROUND

The present invention generally relates to the field of semiconductor devices, and more particularly to a method of forming source/drain contacts in vertical field-effect transistors (VFETs).

VFETs have been pursued as a potential device option for scaling complementary metal-oxide semiconductors (CMOS) to the 5 nanometer (nm) node and beyond. As opposed s planar CMOS devices, VFETs are oriented vertically with a vertical fin or nanowire that extends upward from the substrate. The fin or nanowire forms the channel region of the transistor. A source region and a drain region are situated in electrical contact with the top and bottom ends of the channel region, while the gate is disposed on one or more of the fin or nanowire sidewalls. Thus, in VFETs the direction of the current flow between the source and drain regions is normal to the main surface of the substrate. Formation of contacts in VFETs can be challenging, as overlay shift errors can cause etches to penetrate through protective insulator layers, thereby causing short-circuits between conductive contacts and elements of the VFETs.

SUMMARY

According to an embodiment of the present disclosure, a semiconductor structure includes a top source/drain region in contact with a top portion of a channel fin extending perpendicularly from a semiconductor substrate, a bottom source/drain region located above the semiconductor substrate and on opposite sidewalls of a bottom portion of the channel fin, a metal gate located around the channel fin, the metal gate being separated from the top source/drain region by a top spacer and from the bottom source/drain region by a bottom spacer, the metal gate and the top spacer being in contact with an adjacent first interlevel dielectric layer, a silicide layer directly above an uppermost surface of the top source/drain region, and a nitride layer directly above an uppermost surface of the silicide layer. The semiconductor structure further includes a top source/drain contact extending through a second interlevel dielectric layer until an uppermost surface of the nitride layer, a bottom source/drain contact extending through the first interlevel dielectric layer and the second interlevel dielectric layer until an uppermost surface of the bottom source/drain region, and a gate contact extending through the first interlevel dielectric layer and the second interlevel dielectric layer until an uppermost surface of the metal gate, a size of the top source/drain contact, a size of the bottom source/drain contact and a size of the gate contact are substantially similar, and the size of the top source/drain contact is less than a length of the channel fin.

According to another embodiment of the present disclosure, a method of forming a semiconductor structure includes forming a channel fin extending perpendicularly from a semiconductor substrate, forming a bottom source/drain region above the semiconductor substrate and on opposite sidewalls of a bottom portion of the channel fin, forming a top source/drain region in contact with a top portion of the channel fin, forming a metal gate around the channel fin, the metal gate being separated from the top source/drain region by a top spacer and from the bottom source/drain region by a bottom spacer, the metal gate and the top spacer being in contact with an adjacent first interlevel dielectric layer, forming a metal liner above an uppermost surface of the top source/drain region, and forming a protective nitride layer above an uppermost surface of the metal liner. The method further includes forming a top source/drain contact extending through a second interlevel dielectric layer until an uppermost surface of the protective nitride layer, forming a bottom source/drain contact extending through the first interlevel dielectric layer and the second interlevel dielectric layer until an uppermost surface of the bottom source/drain region, and forming a gate contact extending through the first interlevel dielectric layer and the second interlevel dielectric layer until an uppermost surface of the metal gate, a size of the top source/drain contact, a size of the bottom source/drain contact and a size of the gate contact are substantially similar, and the size of the top source/drain contact is less than a length of the channel fin.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
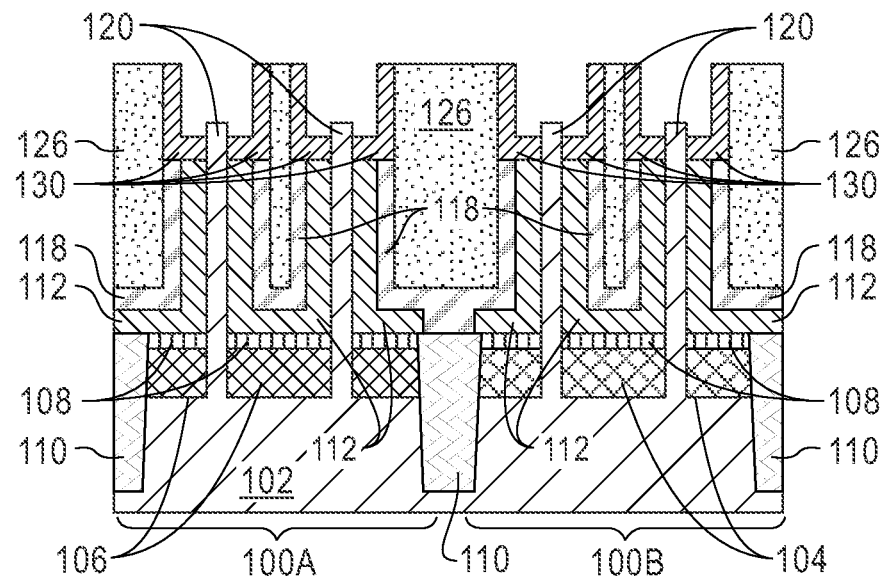
FIG. 1 is a cross-sectional view of a semiconductor structure at an intermediate step during a semiconductor manufacturing process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Some non-planar transistor device architectures, such as VFETs, employ semiconductor fins and side-gates that can be contacted outside the active region, resulting in increased device density over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source/drain region is situated in electrical contact with the top and bottom ends of the channel region (i.e., top source/drain region and bottom source/drain region), while a gate is disposed on one or more of the fin sidewalls.

Contact patterning processes are conducted to form metal contacts to top source/drain region (CA contacts), bottom source/drain region (CR contacts), and gate (CB contacts). As mentioned above, the formation of contacts in VFETs can be challenging, as overlay shift errors can cause etches to penetrate through protective insulator layers, thereby causing short-circuits between conductive contacts and elements of the VFETs. Specifically, current CA etch landing on top source/drain regions can lead to substantial erosion of source/drain epitaxy. Additionally, due to CA size requirements, current VFET patterning requires at least three EUV exposure and etching steps to ensure proper overlay. Thus, current process-of-record (POR) for VFET contact patterning limits silicide formation to only an uppermost portion of the top source/drain epitaxy.

Therefore, embodiments of the present disclosure provides a VFET device, and a method of making the same, in which a selective titanium (Ti) deposition scheme is conducted on top source/drain regions for improving CA landing and protection during contact etching (i.e., no erosion of top source/drain epitaxy) and enabling an early silicide process on top source/drain regions that enhances contact resistance. The selective titanium deposition scheme involves forming a titanium liner above top source/drain epi regions and conducting a nitridation process to form a titanium nitride (TiN) protective layer above the titanium liner. By forming the titanium and titanium nitride liners, a smaller CA opening can be formed, which in turn enables the formation of CA, CB, and CR contacts during a single EUV exposure (i.e., only one lithography mask).

An embodiment by which a VFET device with the selective titanium deposition scheme can be formed is described in detailed below by referring to the accompanying drawings in FIGS. 1-14B.

Referring now to FIG. 1, a cross-sectional view of a semiconductor structure 100 is shown at an intermediate step during a semiconductor manufacturing process, according to an embodiment of the present disclosure.

Known semiconductor fabrication operations have been used to form the semiconductor structure 100 as depicted in FIG. 1. According to an embodiment, the semiconductor structure 100 includes a first region 100A and a second region 100B. The first region 100A includes a positive type or p-type region in which a positive channel Field Effect Transistor (hereinafter "p-FET") can be formed. The second region 100B includes a negative type or n-type region in which a negative channel Field Effect Transistor (hereinafter "n-FET") device can be formed. For illustration purposes only, without intent of limitations, the first region 100A is a p-type region and the second region 100B is a n-type region. Those skilled in the art may know that the first region 100A and the second region 100B can have any polarity as needed to satisfy design requirements.

Each of the first region 100A and second region 100B of the semiconductor structure 100 includes a channel fin 120 extending vertically or perpendicularly to a semiconductor substrate 102. A first bottom source/drain region 106 is formed above a portion of the semiconductor substrate 102 located on the first region 100A of the semiconductor structure 100. The first bottom source/drain region 106 is formed along opposite sidewalls of a first bottom portion of each channel fin 120 in the first region 100A. Similarly, a second bottom source/drain region 104 is formed above a portion of the semiconductor substrate 102 located on the second region 100B of the semiconductor structure 100. The second bottom source/drain region 104 is formed along opposite sidewalls of a second bottom portion of each channel fin 120 in the second region 100B.

It should be noted that virtually all semiconductor transistors are based on the formation of junctions. Junctions are capable of both blocking current and allowing it to flow, depending on an applied bias. Junctions are typically formed by placing two semiconductor regions with opposite polarities into contact with one another. As may be known by those skilled in the art, the most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

According to an embodiment, the semiconductor substrate 102 can be any suitable substrate material, such as, for example, monocrystalline Si, SiGe, SiC, III-V compound semiconductor, II-VI compound semiconductor, or semiconductor-on-insulator (SOI). In some embodiments, the semiconductor substrate 102 includes a buried oxide layer (not depicted).

The first bottom source/drain region 106 and the second bottom source/drain region 104 can be epitaxially grown after formation of the channel fin 120, with the necessary doping to form the first bottom source/drain region 106 and the second bottom source/drain region 104 being provided through in-situ doping during the epitaxial growth process, or through ion implantation after the first bottom source/drain region 106 and the second bottom source/drain region 104 are formed. The first bottom source/drain region 106 and the second bottom source/drain region 104 can be formed by any suitable doping technique, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. In an exemplary embodiment, the dopant concentration in the first bottom source/drain region 106 (i.e., p-FET or first region 100A) can range from approximately $1 \times 10^{19}$ cm$^{-3}$ to approximately $2 \times 10^{21}$ cm$^{-3}$, or preferably between $2 \times 10^{20}$ cm$^{-3}$ and $1 \times 10^{21}$ cm$^{-3}$, while the dopant concentration in the second bottom source/drain region 104 (i.e., n-FET or second region 100B) can range from approximately $1 \times 10^{19}$ cm$^{-3}$ to approximately $2 \times 10^{21}$ cm$^{-3}$, or preferably between $2 \times 10^{20}$ cm$^{-3}$ and $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon (Si) layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

With continued reference to FIG. 1, the semiconductor structure 100 further includes a bottom spacer 108 located above each of the first bottom source/drain region 106 and the second bottom source/drain region 104 and along opposite sidewalls of a bottom portion of each of the channel fins 120 not covered by the first bottom source/drain region 106 and the second bottom source/drain region 104, as illustrated in the figure.

The bottom spacer 108 can include a dielectric material, such as, for example, SiN, SiC, SiOC, SiCN, BN, SiBN, SiBCN, SiOCN, SiOxNy, and combinations thereof. The dielectric material can be a low-k material having a dielectric constant less than about 7, less than about 5, or even less than about 2.5. The bottom spacer 108 can be formed using combinations of known deposition and etching processes, such as, for example, chemical vapor deposition (CVD), plasma-enhanced chemical vapor deposition (PECVD), atomic layer deposition (ALD), physical vapor deposition (PVD), chemical solution deposition, and etching processes including reactive ion etch (ME), wet etch, or isotropic vapor phased dry etch.

Shallow trench isolation (STI) regions 110 are configured and arranged as shown in the figure to electrically isolate active regions of the first region 100A from active regions of the second region 100B. As depicted in the figure, the STI regions 110 are formed within the semiconductor substrate 102. Shallow trench isolation regions, such as the STI regions 110, are frequently used in semiconductor technology to separate active regions within the semiconductor substrate 102 and prevent electric current leakage between adjacent components. The process of forming the STI regions 110 is well known in the art, and generally include etching the semiconductor substrate 102 to create recesses that may later be filled with an insulator material using any deposition method known in the art. In some embodiments, the STI regions 110 may consist of any low-k dielectric material including, but not limited to, silicon nitride, silicon oxide, silicon oxy-nitride and fluoride-doped silicate glass.

A metal gate stack 112 is formed along opposite sidewalls of each of the channel fins 120 in both the first region 100A and the second region 100B. As illustrated in the figure, the metal gate stack 112 is formed in direct contact with the channel fins 120. For ease of illustration, the metal gate stack 112 is depicted as only one layer. However, as known by those skilled in the art, the metal gate stack 112 can include a gate dielectric and a gate conductor/metal (e.g., a work function metal (WFM)) deposited over the bottom spacer 108 and adjacent to a portion of the channel fins 120. In some embodiments, the metal gate stack 112 is deposited by ALD.

The gate dielectric (not shown) can be formed from one or more gate dielectric films. The gate dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric films can further include dopants such as, for example, lanthanum and aluminum. The gate dielectric films can be formed by suitable deposition processes, for example, CVD, PECVD, ALD, PVD, chemical solution deposition, or other like processes. The thickness of the gate dielectric films can vary depending on the deposition process as well as the composition and number of high-k dielectric materials used.

The gate conductor (not shown) in the metal gate stack 112 can include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the gate conductor can be a WFM deposited over the gate dielectric films by a suitable deposition process, for example, CVD, PECVD, PVD, plating, thermal or e-beam evaporation, and sputtering. The type of WFM depends on the type of transistor and can differ between n-FET and p-FET devices. P-type WFMs include compositions such as titanium nitride (TiN), ruthenium, palladium, platinum, cobalt, nickel, and conductive metal oxides, or any combination thereof. N-type WFMs include compositions such as titanium carbide (TiC), titanium aluminum carbide (TiAlC), hafnium, zirconium, titanium, tantalum, aluminum, metal carbides (e.g., hafnium carbide, zirconium carbide, titanium carbide, and aluminum carbide), aluminides, or any combination thereof. The gate conductor can further include a tungsten (W), titanium (Ti), aluminum (Al), cobalt (Co), or nickel (Ni) material over the WFM layer of the gate conductor. The gate conductor can be deposited by a suitable deposition process, for example, CVD, PECVD, PVD, plating, thermal or e-beam evaporation, and sputtering.

In this embodiment, the metal gate stack 112 is conformally deposited on the semiconductor structure 100. After deposition of the metal gate stack 112, a patterning process is conducted on the semiconductor structure 100 to etch the unwanted metal gate stack 112. A nitride cap 118 is formed above the metal gate stack 112 and above a portion of the STI region 110 located between the first regions 100A and the second region 100B, as illustrated in the figure. Any known deposition method can be used to form the nitride cap 118. The nitride cap 118 may include a conformal layer of silicon nitride.

With continued reference to FIG. 1, a first interlevel dielectric (ILD) layer 126 is formed to fill voids between gate structures and other existing devices within the semiconductor structure 100. The first ILD layer 126 may be formed by, for example, CVD of a dielectric material. Non-limiting examples of dielectric materials to form the first ILD layer 126 may include silicon oxide, silicon nitride, hydrogenated silicon carbon oxide, silicon based low-k dielectrics, flowable oxides, porous dielectrics, or organic dielectrics including porous organic dielectrics.

Typically, after deposition of the first ILD layer 126, a chemical mechanical polishing (CMP) process is conducted on the semiconductor structure 100. After this step, an etching process is conducted on the semiconductor structure 100 to expose top portions of the channel fins 120. Etch back of the first ILD layer 126 creates a plurality of trenches (not shown) in the semiconductor structure 100 that exposes the channel fins 120 and within which a top spacer 130 can be formed. Specifically, the top spacer is formed on opposite sides of the exposed top surface of the channel fins 120. The top spacer 130 can be conformally deposited above and in direct contact with the first ILD layer 126, the metal gate stack 112 and the nitride cap 118. In such embodiments, the top spacer 130 may be deposited using, for example, CVD, PECVD, radio-frequency CVD (RFCVD), PVD, ALD, molecular layer deposition (MLD), molecular beam deposition (MBD), pulsed laser deposition (PLD), liquid source misted chemical deposition (LSMCD), sputtering, and/or plating. Non-limiting examples of materials forming the top spacer 130 may include silicon nitride (SiN), silicon boron nitride (SiBN), siliconborocarbonitride (SiBCN), or silicon oxycarbonitride (SiOCN). Any suitable etching technique (e.g., RIE) may be used to remove the top spacer 130 from top surfaces of the channel fins 120, as depicted in the figure.

It should be noted that although bottom spacer 108 and top spacer 130 are depicted on adjacent opposite sides of the channel fins 120, the bottom spacer 108 and the top spacer 130 surround an entire surface of the channel fins 120. The bottom spacer 108 and the top spacer 130 may determine a location of p-n junctions in the semiconductor structure 100.

As may be understood, the various elements that form the semiconductor structure 100 extend along a first axis (e.g., X-axis) to define width dimensions, and extend along a second axis (e.g., Y-axis) perpendicular to the X-axis to define height (or thickness) dimensions. Although not specifically depicted in the cross-sectional view shown in FIG. 1, the various elements that form the semiconductor structure 100 also extend along a third axis (e.g., Z-axis) perpendicular to the first axis and the second axis to define depth dimensions. In accordance with standard VFET architectures, various elements of the semiconductor structure 100 (e.g., bottom spacer 108, metal gate stack 112, etc.) extend completely around the sidewalls of the channel fins 120 in the X, Y, and Z directions.

Figure 2:
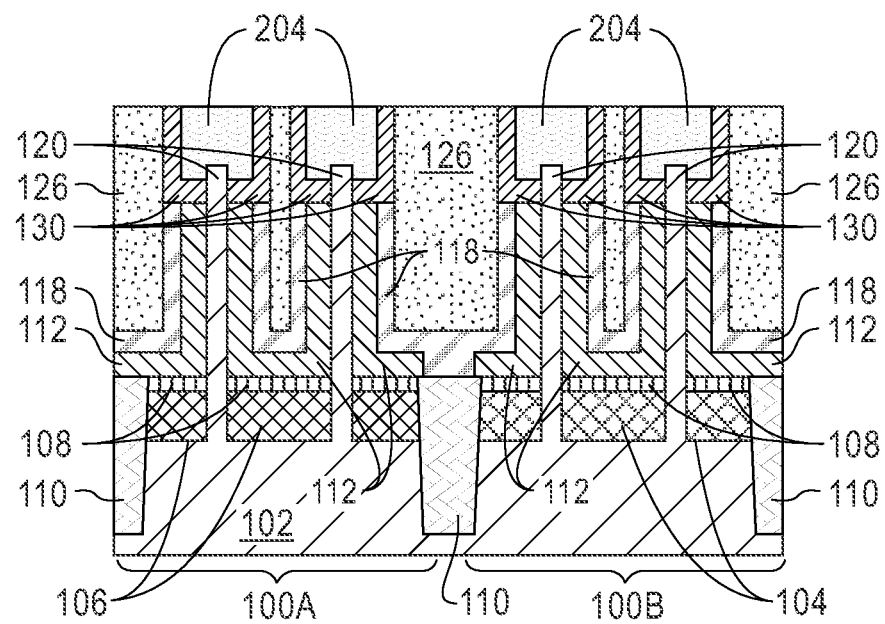
FIG. 2 is a cross-sectional view of the semiconductor structure after forming a sacrificial amorphous silicon layer, according to an embodiment of the present disclosure.

Referring now to FIG. 2, a cross-sectional view of the semiconductor structure 100 is shown after forming a sacrificial layer 204 including an amorphous silicon (a-Si) material above the top spacer 130 and the exposed portion of the channel fins 120, according to an embodiment of the present disclosure.

In this embodiment, the a-Si material forming the sacrificial layer 204 is deposited on each of the first region 100A (i.e., PFET region) and the second region 100B (i.e., NFET region). The a-Si material provides good selectivity over oxides and silicon nitride (SiN). Preferably, a low-temperature deposition process (T<400° C.) is conducted to form the sacrificial layer 204. The low deposition process has the advantage of eliminating diffusion concerns. Specifically, less dopant diffusion occurs from bottom junctions, while oxide regrow is reduced in the metal gate stack 112.

Figure 3:
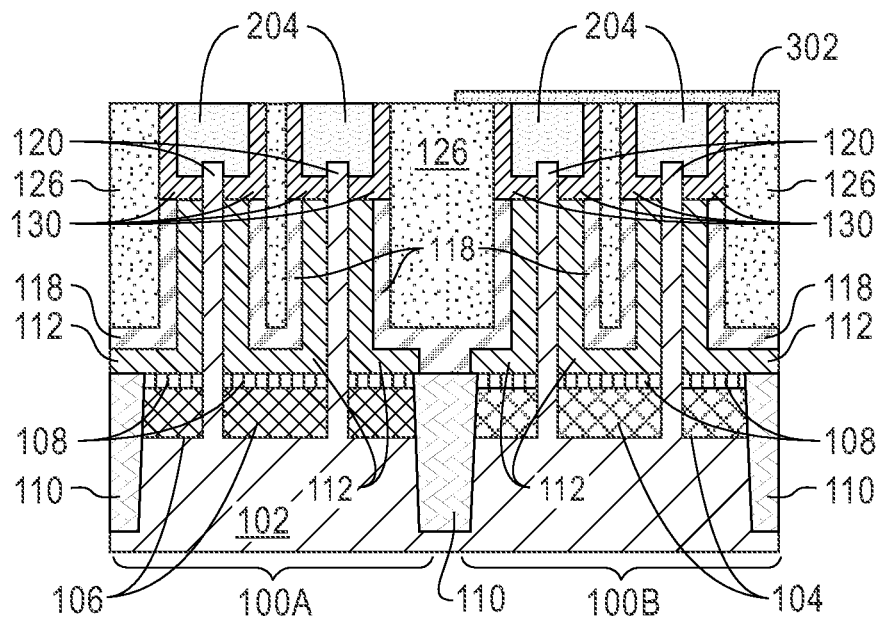
FIG. 3 is a cross-sectional view of the semiconductor structure after forming a masking layer on a second or n-type region of the semiconductor structure, according to an embodiment of the present disclosure.

Referring now to FIG. 3, a cross-sectional view of the semiconductor structure 100 is shown after forming a masking layer 302 on the second region 100B of the semiconductor structure 100, according to an embodiment of the present disclosure.

As shown in the figure, the masking layer 302 is formed above the first ILD layer 126, top spacer 130 and sacrificial layer 204 on the second region 100B. The masking layer 302 may protect the NFET device formed on the second region 100B during processing steps conducted to form first top source/drain regions 402 as described in FIG. 4 below. Typically, the masking layer 302 includes a hardmask material such as silicon nitride. The steps involved in forming the masking layer 302 to cover the second region 100B of the semiconductor structure 100 are conventional and well known to those skilled in the art.

Figure 4:
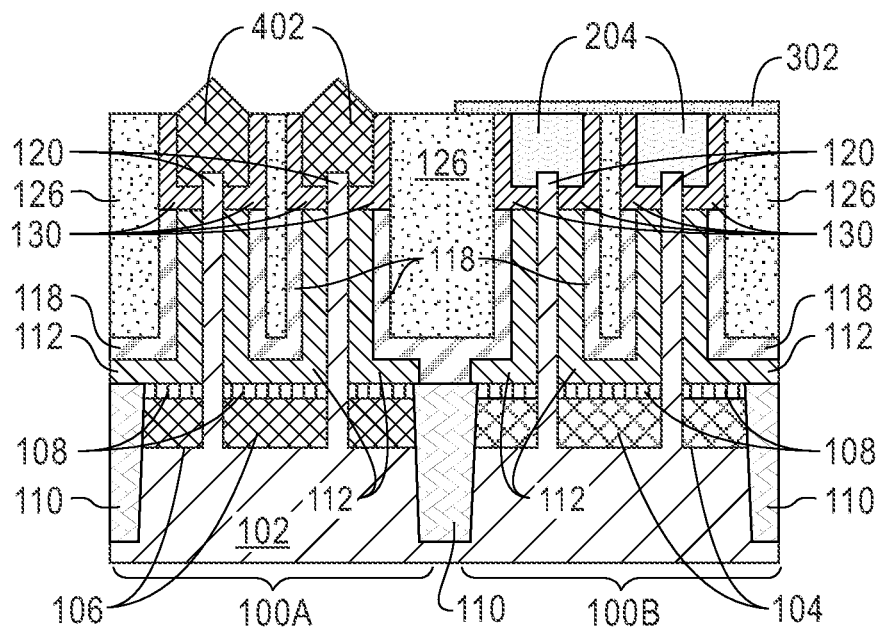
FIG. 4 is a cross-sectional view of the semiconductor structure after forming first top source/drain regions on a first or p-type region of the semiconductor structure, according to an embodiment of the present disclosure.

Referring now to FIG. 4, a cross-sectional view of the semiconductor structure 100 is shown after forming first top source/drain regions 402 on the first region 100A, according to an embodiment of the present disclosure.

In this embodiment, prior to forming the first top source/drain regions 402, the exposed sacrificial layer 204 (FIG. 3) is removed from the first region 100A of the semiconductor structure 100 using standard etching techniques. For example, in an embodiment, the sacrificial layer 204 (FIG. 3) can be removed by hot ammonia wet etch. In another embodiment, a selective dry etch can be used to remove the sacrificial layer 204 (FIG. 3).

After removing the sacrificial layer 204 from the semiconductor structure 100, the first top source/drain region 402 can be epitaxially grown off the exposed portion of the channel fins 120, within a remaining space (not shown) above the channel fins 120 and top spacer 130 on the first region 100A. The epitaxial process used to form the first top source/drain regions 402 is similar to the one described above with reference to the first and second bottom source/drain regions 106, 104 and may include selective epitaxial growth of an in-situ p-type doped material on the exposed surfaces of the channel fins 120.

In an exemplary embodiment, the p-type doped material forming the first top source/drain regions 402 may include boron-doped silicon-germanium (SiGe:B) with a germanium (Ge) concentration varying from approximately 20% to approximately 70% and a boron (B) concentration varying from approximately $1\times10^{20}$ cm$^{-3}$ to approximately $2\times10^{21}$ cm$^{-3}$. According to a preferred embodiment, the epitaxial growth process is conducted at a low temperature (T<500° C.). As may be known by those skilled in the art, the diamond shape observed in the first top source/drain regions 402 may be a consequence of the different growth rates during the epitaxial deposition process inherent to each crystallographic orientation plane of the material forming the first top source/drain regions 402.

Figure 5:
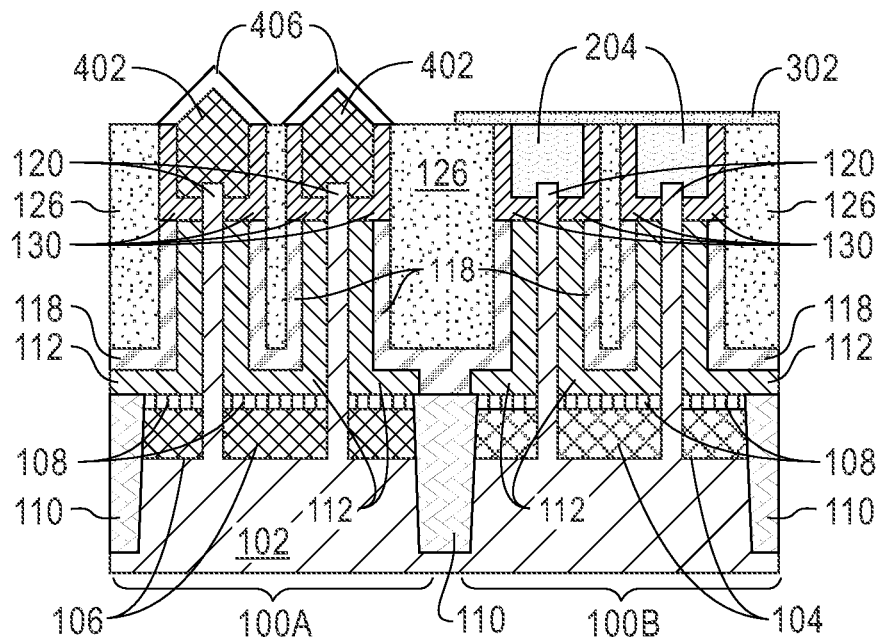
FIG. 5 is a cross-sectional view of the semiconductor structure after forming a first metal liner above the first top source/drain regions, according to an embodiment of the present disclosure.

Referring now to FIG. 5, a cross-sectional view of the semiconductor structure 100 is shown after forming a first metal liner 406 above the first top source/drain regions 402 on the first region 100A, according to an embodiment of the present disclosure.

The first metal liner 406 can be selectively deposited on a top surface of the first top source/drain regions 402 by any known deposition method. For example, a chemical vapor deposition (CVD) process selective to silicon (Si) and silicon-germanium (SiGe) can be used to selectively form the first metal liner 406 above the first top source/drain regions 402, as depicted in the figure. In an embodiment, the first metal liner 406 is made of titanium (Ti) and may have a thickness varying from approximately 3 nm to approximately 10 nm and ranges therebetween.

It should be noted that deposition of the titanium liner (i.e., first metal liner 406) is a selective process that can only happen on Si or SiGe surfaces. Stated differently, titanium growth only occurs on the epi surface of the first top source/drain regions 402 and not in other areas of the semiconductor structure 100.

According to an embodiment, the first metal liner 406 formed directly above the first top source/drain regions 402 allows the subsequent formation of a protective titanium nitride layer (not shown) and an early silicide process, as will be described in detail below.

Figure 6:
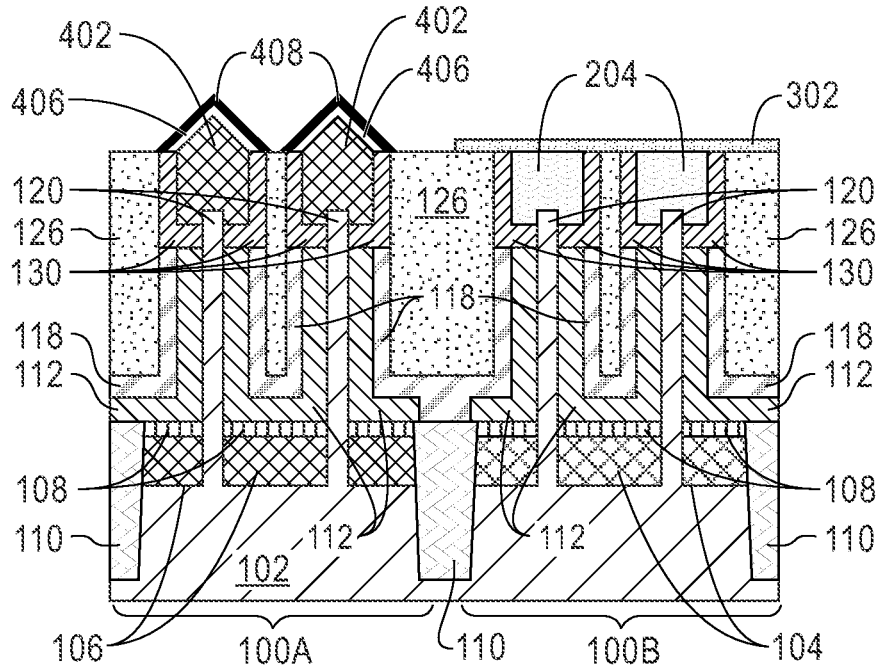
FIG. 6 is a cross-sectional view of the semiconductor structure after conducting a nitrididation process to nitridize a top surface of the first metal liner and form a first nitride layer, according to an embodiment of the present disclosure.

Referring now to FIG. 6, a cross-sectional view of the semiconductor structure 100 is shown after conducting a nitrididation process to nitridize a top surface of the first metal liner 406 and form a first nitride layer 408, according to an embodiment of the present disclosure.

In this embodiment, the first metal liner 406 made of titanium is subjected to a nitridation process to form a protective titanium nitride (TiN) layer or simply first nitride layer 408 on the top surface of the first metal liner 406. As may be known by those skilled in the art, typical methods of forming TiN thin films include physical vapor deposition (PVD, usually sputter deposition, cathodic arc deposition or electron beam heating) and chemical vapor deposition (CVD). In both methods, pure titanium (i.e., first metal liner 406) is sublimed and reacted with nitrogen in a high-energy, vacuum environment. According to an embodiment, a thickness of the first nitride layer 408 may vary from approximately 2 nm to approximately 5 nm and ranges therebetween.

According to an embodiment, after the nitridation process a portion of the first metal liner 406 remains below the first nitride layer 408, as depicted in the figure. Thus, due to the physical characteristics of TiN films, the first nitride layer 408 acts as an effective barrier for protecting the underlying first metal liner 406, preventing erosion of the first top source/drain regions 402 during contact formation, and reducing diffusion from subsequently formed silicide films.

Figure 7:
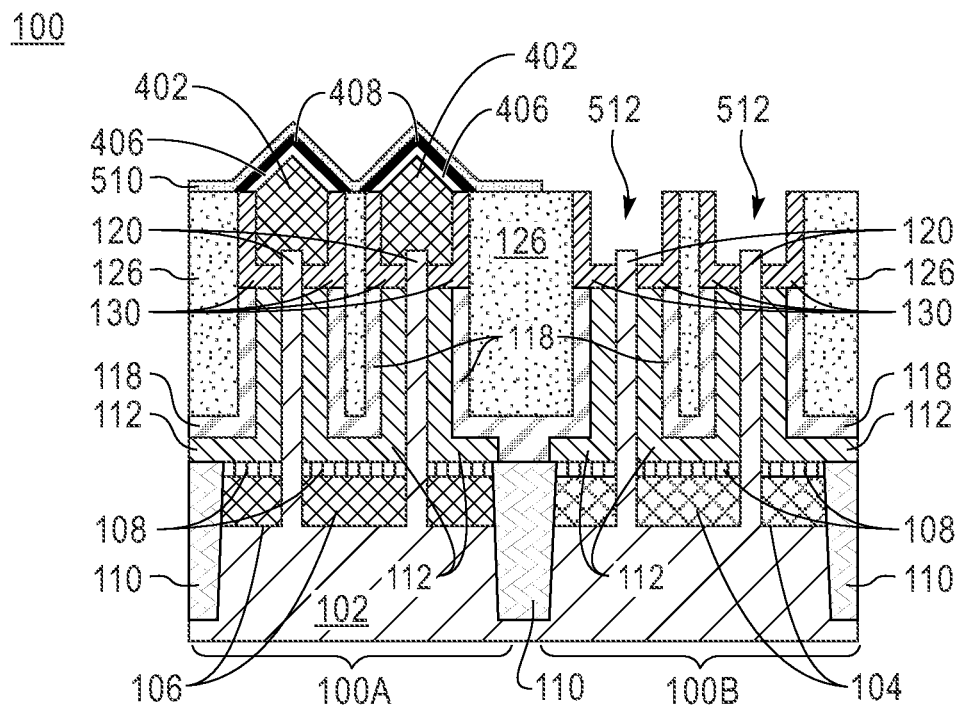
FIG. 7 is a cross-sectional view of the semiconductor structure after forming a masking layer on the first region and removing the sacrificial layer from the second region, according to an embodiment of the present disclosure.

Referring now to FIG. 7, a cross-sectional view of the semiconductor structure 100 is shown after forming a masking layer 510 on the first region 100A and removing the sacrificial layer 204 from the second region 100B, according to an embodiment of the present disclosure.

Similar to the masking layer 302 (FIG. 3), the masking layer 510 is formed above the first ILD layer 126 and top surface of the first nitride layer 408 on the first region 100A of the semiconductor structure 100 to protect the PFET device being formed during subsequent processing steps conducted to form second top source/drain regions 602 as described in FIG. 8 below. Typically, the masking layer 510 includes a hardmask material such as silicon nitride. The steps involved in forming the masking layer 510 to cover the first region 100A of the semiconductor structure 100 are conventional and well known to those skilled in the art.

In this embodiment, after forming the masking layer 510, the sacrificial layer 204 (FIG. 6) is removed from the second region 100B of the semiconductor structure 100, as depicted in the figure. Standard etching techniques can be implemented to remove the sacrificial layer 204 (FIG. 6). For example, in an embodiment, a hot ammonia wet etch can be used to remove the sacrificial layer 204 from the second region 100B. In another embodiment, a selective dry etch can be used to remove the sacrificial layer 204 (FIG. 6). After removing the sacrificial layer 204 (FIG. 6) from the semiconductor structure 100, an opening 512 remains above top portions of the channel fins 120 and top spacer 130 of the second region 100B. The opening 512 exposed the top portions of the channel fins 120.

Figure 8:
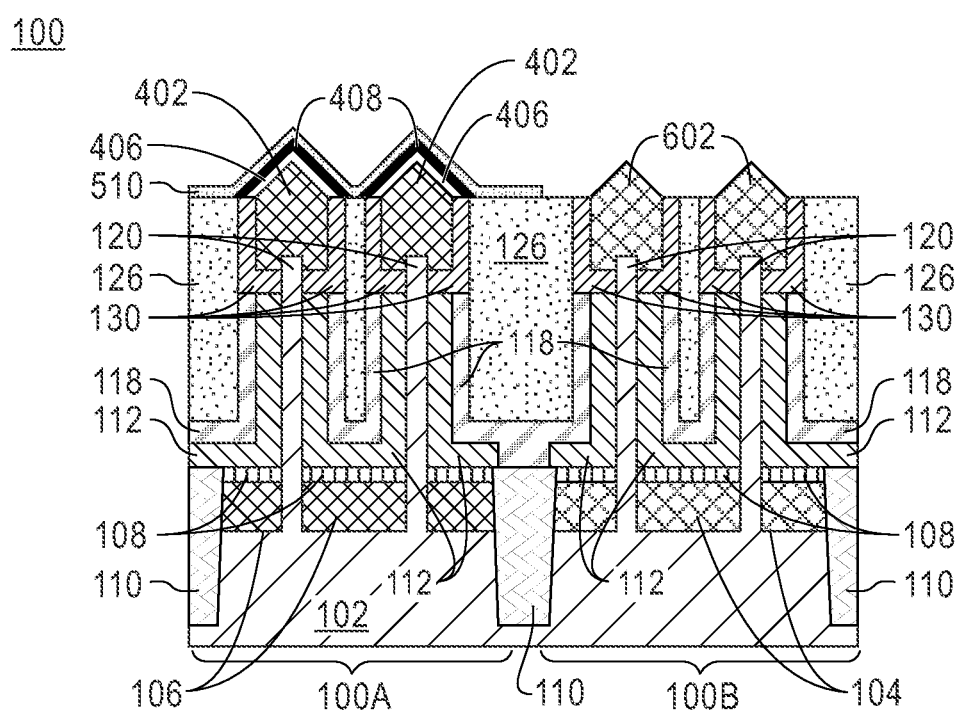
FIG. 8 is a cross-sectional view of the semiconductor structure after forming second top source/drain regions on the second region of the semiconductor structure, according to an embodiment of the present disclosure.

Referring now to FIG. 8, a cross-sectional view of the semiconductor structure 100 is shown after forming second top source/drain regions 602 on the second region 100B, according to an embodiment of the present disclosure.

In this embodiment, the second top source/drain regions 602 can be epitaxially grown off the exposed portion of the channel fins 120 within the opening 512 (FIG. 7) above the channel fins 120 and top spacer 130 of the second region 100B. The epitaxial process used to form the second top source/drain regions 602 is similar to the one described above with reference to the first and second bottom source/drain regions 106, 104 and first top source/drain regions 402. The process may include selective epitaxial growth of an in-situ n-type doped material on the exposed surfaces of the channel fins 120. In an exemplary embodiment, the n-type doped material forming the second top source/drain regions 602 may include a phosphorus-doped silicon (Si:P) material with a phosphorus (P) concentration varying from approximately $1 \times 10^{20}$ cm$^{-3}$ to approximately $3 \times 10^{21}$ cm$^{-3}$. According to a preferred embodiment, the epitaxial growth process is conducted at a low temperature (T<500° C.). As may be known by those skilled in the art, the diamond shape observed in the second top source/drain regions 602 may be a consequence of the different growth rates during the epitaxial deposition process inherent to each crystallographic orientation plane of the material forming the second top source/drain regions 602.

Figure 9:
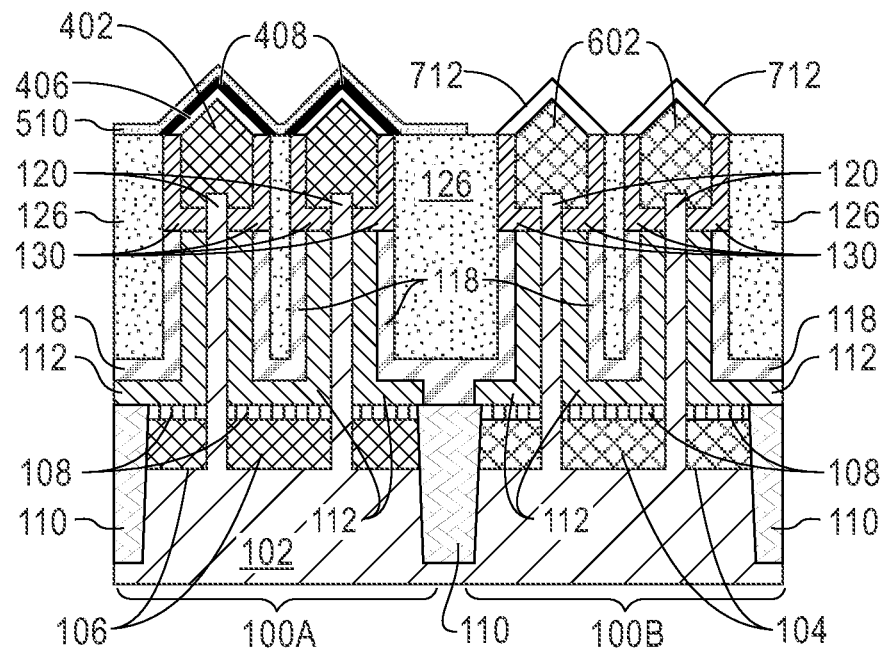
FIG. 9 is a cross-sectional view of the semiconductor structure after forming a second metal liner above the second top source/drain regions on the second region of the semiconductor structure, according to an embodiment of the present disclosure.

Referring now to FIG. 9, a cross-sectional view of the semiconductor structure 100 is shown after forming a second metal liner 712 above the second top source/drain regions 602 on the second region 100B, according to an embodiment of the present disclosure.

In this embodiment, the second metal liner may include similar material(s) and may be formed in analagous ways to the the first metal liner 406. Specifically, the second metal liner 712 can be selectively deposited on a top surface of the second top source/drain regions 602 by any known deposition method. For example, a chemical vapor deposition (CVD) process selective to silicon (Si) and silicon-germanium (SiGe) can be used to form the second metal liner 712 above the second top source/drain regions 602, as depicted in the figure. In an embodiment, the second metal liner 712 is made of titanium (Ti) and may have a thickness varying from approximately 3 nm to approximately 10 nm and ranges therebetween.

As previously explained, deposition of the titanium liner (i.e., first metal liner 406 and second metal liner 406) is a selective process that can only happen on Si or SiGe surfaces. Stated differently, titanium growth only occurs on the epi surface of the first top source/drain regions 402 and the second top source/drain regions 602 (as shown in the figure), and not in other areas of the semiconductor structure 100.

According to an embodiment, similar to the first metal liner 406, the second metal liner 712 formed directly above the second top source/drain regions 602 allows the subsequent formation of a protective titanium nitride layer (not shown) and an early silicide process, as will be described in detail below.

Figure 10:
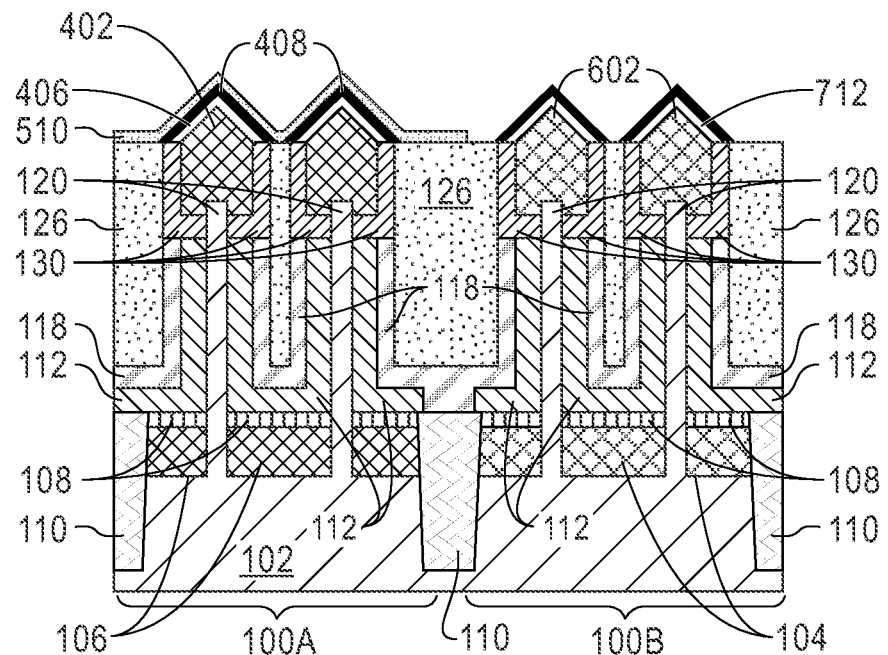
FIG. 10 is a cross-sectional view of the semiconductor structure after conducting a nitrididation process to nitridize a top surface of the second metal liner and form a second nitride layer, according to an embodiment of the present disclosure.

Referring now to FIG. 10, a cross-sectional view of the semiconductor structure 100 is shown after conducting a nitrididation process to nitridize a top surface of the second metal liner 712 and form a second nitride layer 802, according to an embodiment of the present disclosure.

In this embodiment, similar to the first metal liner 406, the second metal liner 712 made of titanium is subjected to a nitridation process to form a protective titanium nitride (TiN) layer or simply second nitride layer 802 on the top surface of the second metal liner 712. As may be known by those skilled in the art, typical methods of forming TiN thin films include physical vapor deposition (PVD, usually sputter deposition, cathodic arc deposition or electron beam heating) and chemical vapor deposition (CVD). In both methods, pure titanium (i.e., second metal liner 712) is sublimed and reacted with nitrogen in a high-energy, vacuum environment. According to an embodiment, a thickness of the second nitride layer 802 may vary from approximately 2 nm to approximately 5 nm and ranges therebetween.

According to an embodiment, after the nitridation process a portion of the metal liner 712 remains below the second nitride layer 802, as depicted in the figure. Thus, due to the physical characteristics of TiN films, the second nitride layer 802 acts as an effective barrier for protecting the underlying metal liner 712, preventing erosion of the second top source/drain regions 602 during contact formation, and reducing diffusion from subsequently formed silicide films.

Figure 11A:
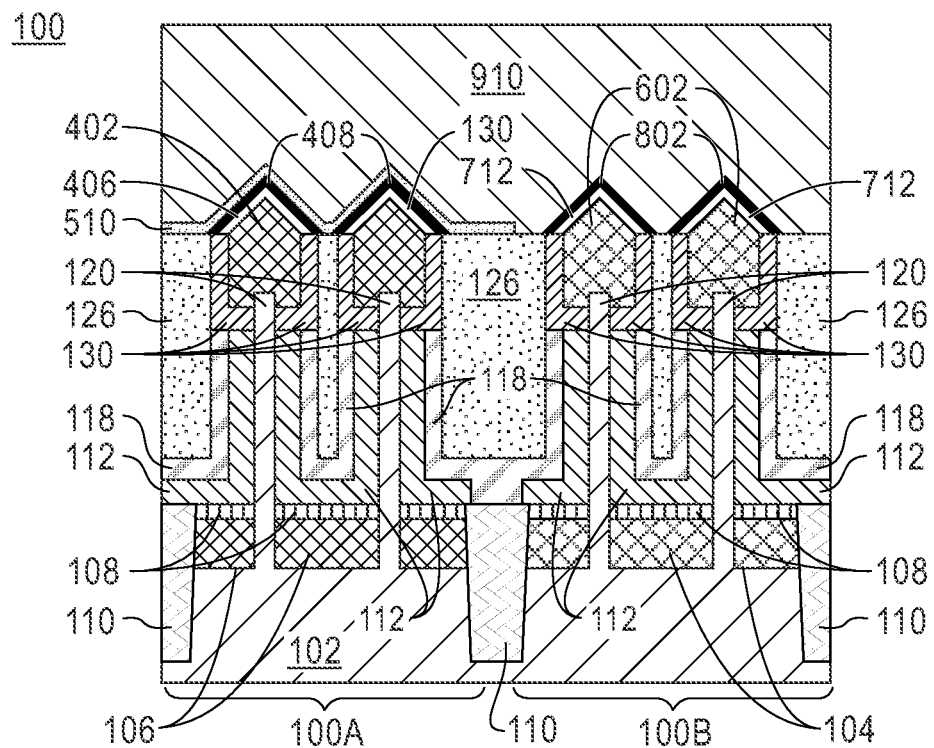
FIG. 11A is a cross-sectional view of the semiconductor structure across a channel fin after forming a second ILD layer, according to an embodiment of the present disclosure.
Figure 11B:
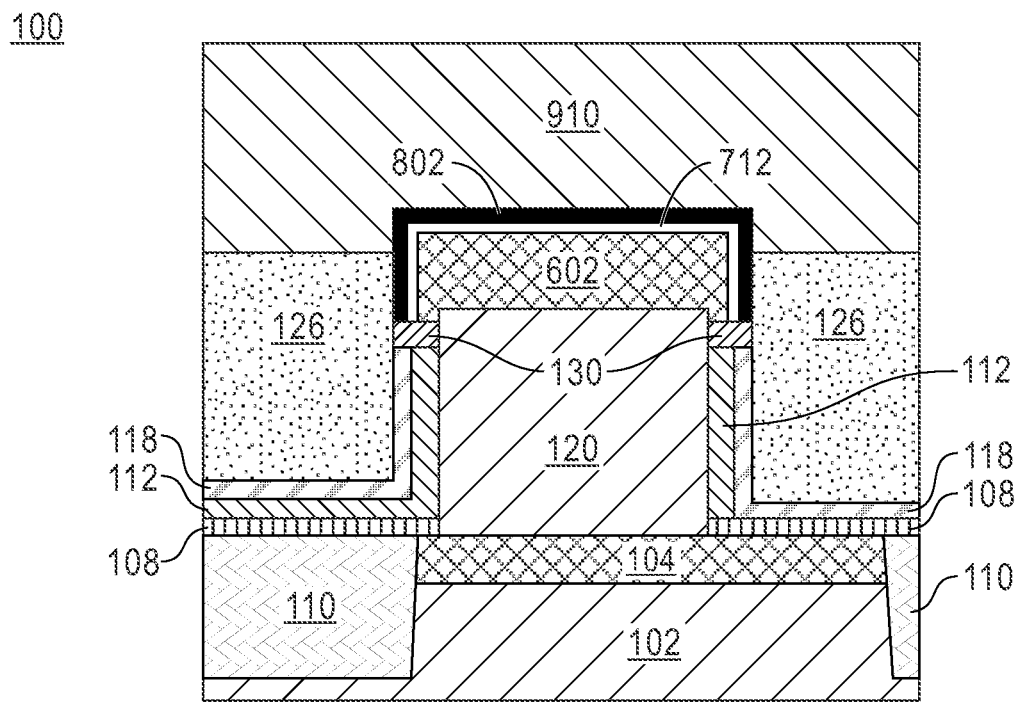
FIG. 11B is a cross-sectional view of the semiconductor structure of FIG. 11A along the channel fin, according to an embodiment of the present disclosure.

Referring now to FIG. 11A, a cross-sectional view of the semiconductor structure 100 across a channel fin 120 is shown after forming a second ILD layer 910, according to an embodiment of the present disclosure. In this embodiment, FIG. 11B is a cross-sectional view of the semiconductor structure 100 along the channel fin 120.

The second ILD layer 910 is formed on the semiconductor structure 100 above the masking layer 510 on the first top source/drain regions 402 and above the second nitride layer 802 on the second top source/drain region 602. The second ILD layer 910 is formed in preparation for device contact formation, as will described in detail below. The second ILD layer 910 may be formed by, for example, CVD of a dielectric material. Non-limiting examples of dielectric materials to form the second ILD layer 910 may include silicon oxide, silicon nitride, hydrogenated silicon carbon oxide, silicon based low-k dielectrics, flowable oxides, porous dielectrics, or organic dielectrics including porous organic dielectrics.

Typically, after deposition of the second ILD layer 910, a chemical mechanical polishing (CMP) process is conducted on the semiconductor structure 100.

Figure 12:
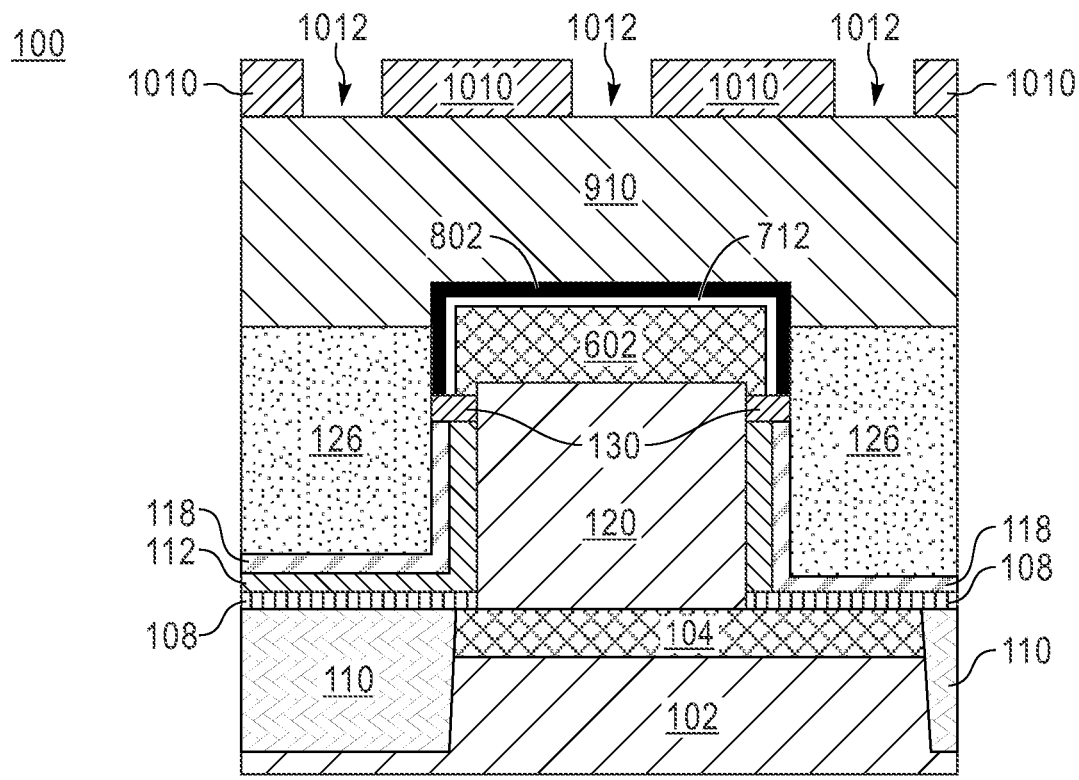
FIG. 12 is a cross-sectional view of the semiconductor structure along a channel fin after depositing a photoresist layer, according to an embodiment of the present disclosure.
Figure 13:
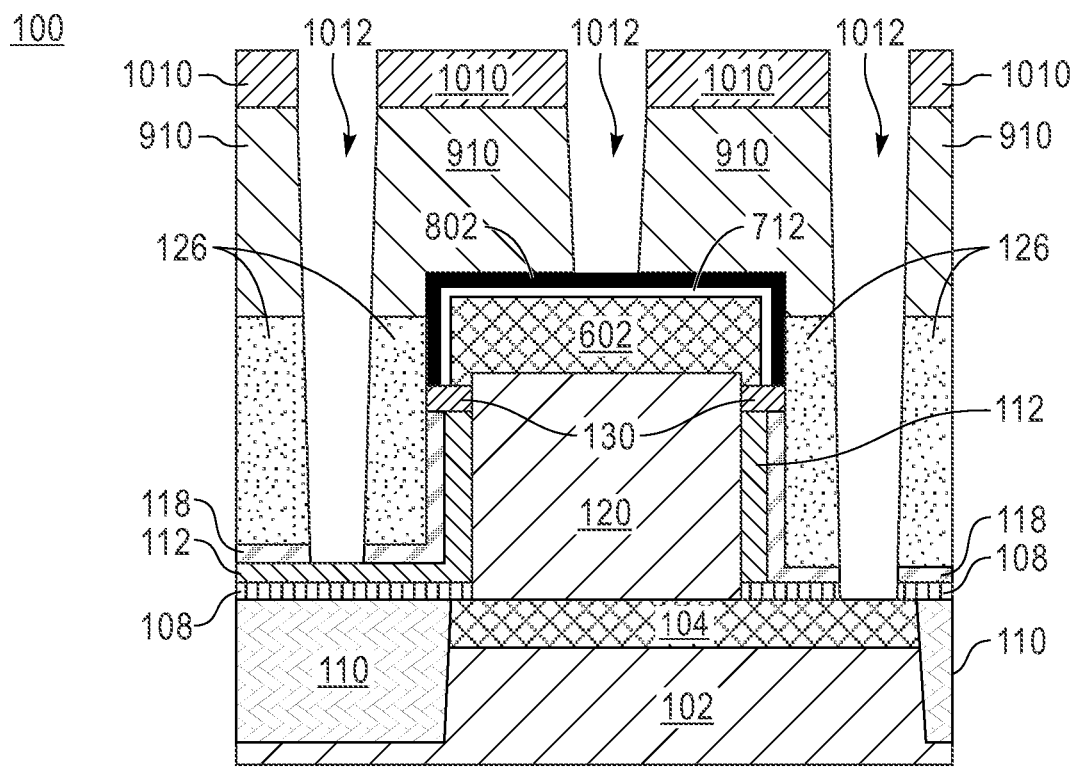
FIG. 13 is a cross-sectional view of the semiconductor structure along a channel fin after forming contact trenches, according to an embodiment of the present disclosure.

Referring now to FIG. 12 and FIG. 13 simultaneously, cross-sectional views of the semiconductor structure 100 along a channel fin 120 in the second region 100B are shown after depositing a photoresist layer 1010 and forming contact trenches 1012, according to an embodiment of the present disclosure. The photoresist layer 1010 is deposited above the second ILD layer 910 for forming the contact trenches 1012 using well-known lithography and reactive ion etch (ME) processing.

As known by those skilled in the art, patterning of the second ILD layer 910 to form the contact trenches 1012 involves exposing a pattern (not shown) on the photoresist layer 1010 and transferring the exposed pattern to the second ILD layer 910, as shown in the figures. After transferring the pattern and forming the contact trenches 1012, the photoresist layer 1010 can be removed using any photoresist striping method known in the art including, for example, plasma ashing.

As can be observed in FIG. 13, the contact trenches 1012 expose a top surface of the metal gate stack 112, a top surface of the second nitride layer 802, and a top surface of second bottom source/drain region 104 located in the second region 100B. Although not depicted in the figure, the contact trenches 1012 also expose a top surface of the metal gate stack 112, a top surface of the first nitride layer 408, and a top surface of first bottom source/drain region 106 located in the first region 100A.

Figure 14A:
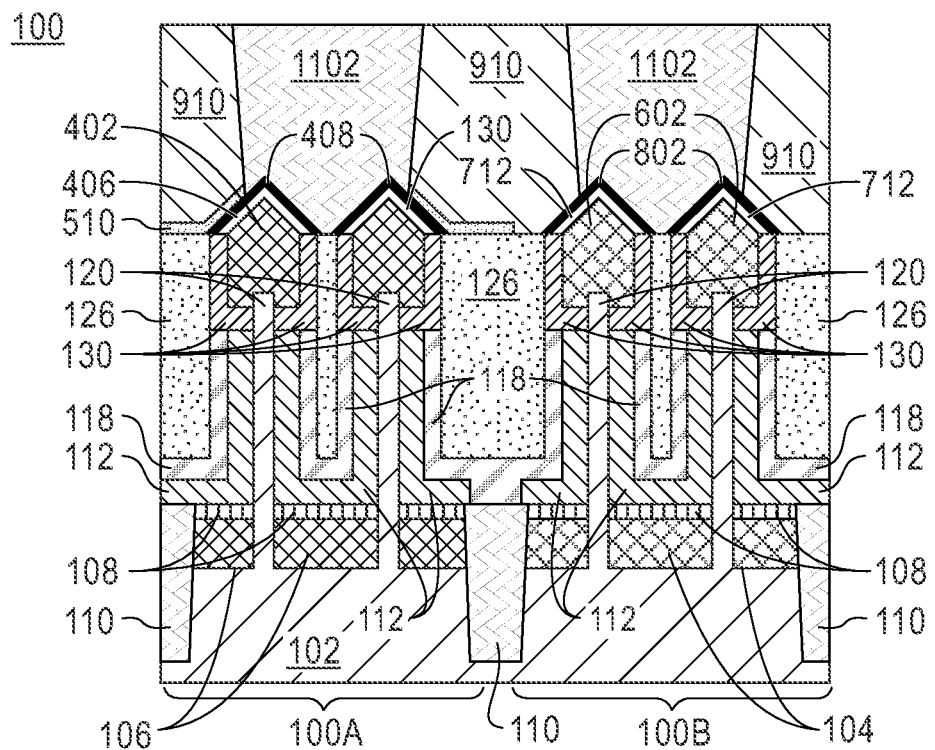
FIG. 14A is a cross-sectional view of the semiconductor structure across a channel fin after middle-of-line (MOL) contact metallization and silicide anneal, according to an embodiment of the present disclosure.

Referring now to FIG. 14A, a cross-sectional view of the semiconductor structure 100 across a channel fin 120 is shown after middle-of-line (MOL) contact metallization, according to an embodiment of the present disclosure. In this embodiment, FIG. 14B is a cross-sectional view of the semiconductor structure 100 along the channel fin 120.

As illustrated in FIG. 14A, top source/drain contacts 1102 (i.e., CA contacts) extend all the way until an uppermost surface of the first nitride layer 408 on the first top source/drain regions 402 and an uppermost surface of the second nitride layer 802 on the second top source/drain region 602. It should be noted that standard etching techniques can be used to selectively remove portions of the masking layer 510 from the first top source/drain regions 402 and expose the uppermost surface of the first nitride layer 408, as depicted in FIG. 14A. Stated differently, according to an embodiment, portions of the masking layer 510 may remain in the first region 100A of the semiconductor structure 100 partially covering the first nitride layer 408 located above the first top source/drain regions 402.

Figure 14B:
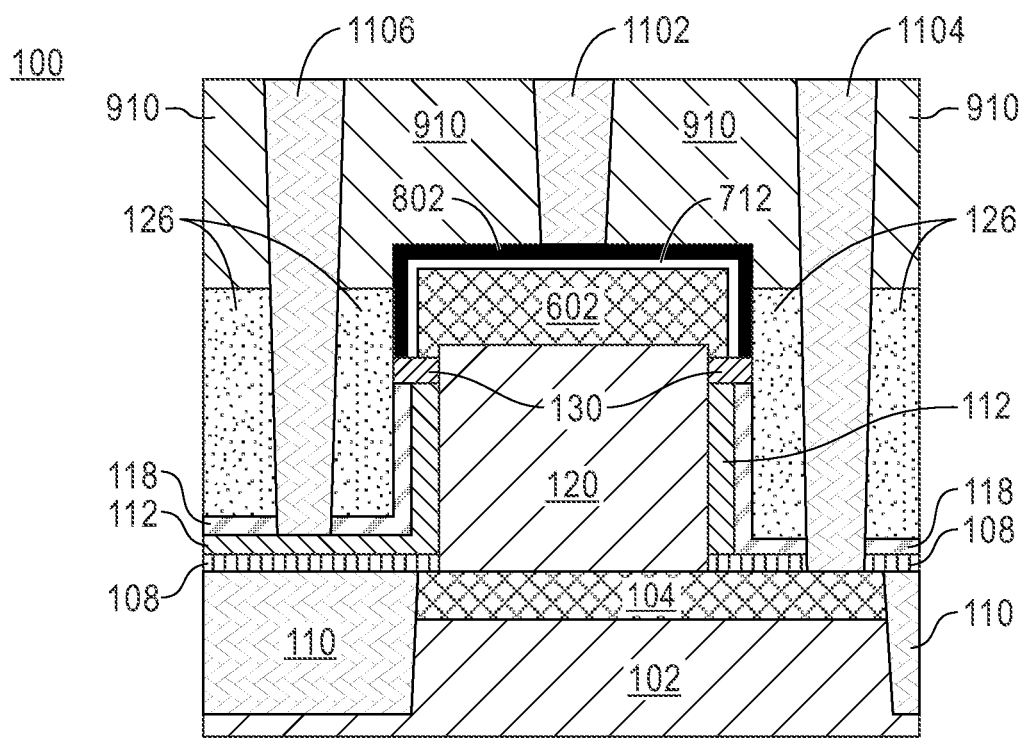
FIG. 14B is a cross-sectional view of the semiconductor structure of FIG. 14A along the channel fin, according to an embodiment of the present disclosure.

Similarly, bottom source/drain contacts 1104 (i.e., CR contacts) extend all the way through an uppermost surface of the first bottom source/drain regions 106 (not shown) and an uppermost surface of the second bottom source/drain regions 104 (shown in FIG. 14B). The process of forming metal contacts is standard and well-known in the art. Typically, the process includes patterning contact trenches, such as contact trenches 1012 in FIGS. 12-13, in a dielectric layer (i.e., second ILD layer 910) and filling the patterned contact trenches with a conductive material or a combination of conductive materials. The conductive material filling the top source/drain contacts 1102, bottom source/drain contacts 1104, and gate contacts 1106 includes a conductive metal, for example, aluminum (Al), platinum (Pt), gold (Au), tungsten (W), titanium (Ti), cobalt (Co), ruthenium (Ru), copper (Cu), or any combination thereof. It should be noted that, in some embodiments, an adhesion metal liner (not shown) may be used before conductive metal depth, such as TiN, TaN, etc. The conductive material may be deposited by a suitable deposition process, for example, CVD, PECVD, PVD, plating, thermal or e-beam evaporation, or sputtering. A planarization process such as CMP is generally performed to remove any conductive material from surfaces of the semiconductor structure 100.

According to an embodiment, a size of the top source/drain contacts 1102 (CA contacts) formed on the first and second top source drain regions 406, 602 may be substantially smaller than a size of top source/drain contacts in current POR, as can be observed in FIG. 14B. As may be known by those skilled in the art, in conventional designs, the CA contact size is similar to or slightly smaller than a length of the channel fin. As can be appreciated in FIG. 14B, embodiments of the present disclosure provide a CA contact (e.g., top source/drain contacts 1102) having a size that is comparable or substantially similar to a size of the CB and CR contacts which is typically around 20-30 nm. Additionally, the smaller CA opening enables CA, CB, and CR lithography at a single EUV exposure, thereby reducing the numbers of masks required for contact patterning.

Finally, a silicide anneal process is conducted on the semiconductor structure 100. During the silicide anneal process, silicon atoms from the first and second top source/drain regions 402, 602 react with titanium atoms from the first and second metal liners 406, 712 to form a titanium silicide film. As can be observed in FIGS. 14A and 14B, the first and second metal liner 406, 712 are formed on an uppermost surface, and opposite sidewalls as shown in FIG. 14B, of the first and second top source/drain regions 402, 602 in direct contact with the diamond-shaped epitaxy. Thus, during the silicide anneal process, (Ti) silicide films are formed on these areas of the first and second top source/drain regions 402, 602 from the first and second metal liners 406, 712 thereby enabling better contact resistance.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
    a channel fin extending perpendicularly from a semiconductor substrate;
    a top source/drain region in contact with a top portion of the channel fin,
    the top source/drain region including a bottom portion abutted by a first side of a top spacer and a top portion extending outwards from the top spacer,
    a second side of the top spacer, opposing the first side, being in contact with a first interlevel dielectric layer;
    a bottom source/drain region disposed above the semiconductor substrate and in contact with opposite sidewalls of a bottom portion of the channel fin;
    a metal gate stack in contact with a central portion of the channel fin, the metal gate stack being separated from the top source/drain region by the top spacer and from the bottom source/drain region by a bottom spacer;
    a silicide layer disposed above and in direct contact with opposite sidewalls of the top portion of the top source/drain region; and
    a nitride layer disposed above and in direct contact with an uppermost surface of the silicide layer,
    a topmost surface of the top spacer being in contact with opposing ends of the silicide layer and the nitride layer.

2. The semiconductor structure of claim 1, further comprising:
    a top source/drain contact extending through a second interlevel dielectric layer until an uppermost surface of the nitride layer;
    a bottom source/drain contact extending through the first interlevel dielectric layer and the second interlevel dielectric layer until an uppermost surface of the bottom source/drain region; and
    a gate contact extending through the first interlevel dielectric layer and the second interlevel dielectric layer until an uppermost surface of the metal gate stack.

3. The semiconductor structure of claim 1, wherein the top portion of the top source/drain region extending outwards from the top spacer comprises a diamond-shaped epitaxial region above which the silicide layer is formed, the top spacer abutting the bottom portion of the top source/drain region including two vertical sections with respect to the semiconductor substrate disposed on opposite sides of the bottom portion of the top source/drain region and a horizontal section with respect to the semiconductor substrate disposed on opposite sides of the channel fin.

4. The semiconductor structure of claim 1, wherein the silicide layer comprises a titanium silicide layer formed from a titanium liner during a silicide anneal process.

5. The semiconductor structure of claim 4, wherein the nitride layer comprises a titanium nitride layer formed from the titanium liner during a nitridation process.

6. The semiconductor structure of claim 1, wherein the top source/drain region is p-type doped for providing a P-FET device.

7. The semiconductor structure of claim 6, further comprising:
    a masking layer disposed above the first interlevel dielectric layer and above a first portion of the nitride layer not covered by the top source/drain contact, a second portion of the nitride layer being in contact with the top source/drain contact, the masking layer being in contact, on a side opposing the nitride layer, with the second interlevel dielectric layer.

8. The semiconductor structure of claim 1, wherein the top source/drain region is n-type doped for providing a N-FET device.

* * * * *